(12) United States Patent
Culler et al.

(10) Patent No.: US 10,005,171 B2
(45) Date of Patent: Jun. 26, 2018

(54) ABRASIVE PARTICLES, METHOD OF MAKING ABRASIVE PARTICLES, AND ABRASIVE ARTICLES

(71) Applicant: 3M INNOVATIVE PROPERTIES COMPANY, St. Paul, MN (US)

(72) Inventors: Scott R. Culler, Burnsville, MN (US); Moses M. David, Woodbury, MN (US); Maiken Givot, St. Paul, MN (US); Piotr S. Stach, Grybów (PL)

(73) Assignee: 3M Innovative Properties Company, St. Paul, MN (US)

( * ) Notice: Subject to any disclaimer, the term of this patent is extended or adjusted under 35 U.S.C. 154(b) by 100 days.

(21) Appl. No.: 14/392,224

(22) PCT Filed: Jun. 5, 2014

(86) PCT No.: PCT/US2014/041109
§ 371 (c)(1),
(2) Date: Dec. 24, 2015

(87) PCT Pub. No.: WO2014/209567
PCT Pub. Date: Dec. 31, 2014

(65) Prior Publication Data
US 2016/0193717 A1    Jul. 7, 2016

Related U.S. Application Data (60) Provisional application No. 61/838,556, filed on Jun. 24, 2013.

(51) Int. Cl.
| | |
|---|---|
| C09K 3/14 | (2006.01) |
| C04B 35/628 | (2006.01) |
| B24D 3/00 | (2006.01) |
| B24D 3/20 | (2006.01) |
| B24D 3/14 | (2006.01) |
| C04B 35/111 | (2006.01) |
| C04B 35/488 | (2006.01) |
| C04B 35/505 | (2006.01) |
| C04B 35/52 | (2006.01) |
| C04B 35/56 | (2006.01) |
| C04B 35/563 | (2006.01) |
| C04B 35/565 | (2006.01) |
| C04B 35/5831 | (2006.01) |
| C23C 16/44 | (2006.01) |

(52) U.S. Cl.
CPC ............... B24D 3/20 (2013.01); B24D 3/14 (2013.01); C04B 35/111 (2013.01); C04B 35/4885 (2013.01); C04B 35/505 (2013.01); C04B 35/52 (2013.01); C04B 35/563 (2013.01); C04B 35/565 (2013.01); C04B 35/5611 (2013.01); C04B 35/5831 (2013.01); C04B 35/62807 (2013.01); C04B 35/62884 (2013.01); C09K 3/1436 (2013.01); C23C 16/4417 (2013.01); C04B 2235/96 (2013.01)

(58) Field of Classification Search
CPC ............ C09K 3/14; C04B 35/628; B24D 3/00
See application file for complete search history.

(56) References Cited

U.S. PATENT DOCUMENTS

| | | |
|---|---|---|
| 2,958,593 A | 11/1960 | Hoover |
| 3,079,361 A | 2/1963 | Plueddemann |
| 4,227,350 A | 10/1980 | Fitzer |
| 4,364,731 A | 12/1982 | Norling |
| 4,473,671 A | 9/1984 | Green |
| 4,539,048 A | 9/1985 | Cohen |
| 4,543,107 A | 9/1985 | Rue |
| 4,588,419 A | 5/1986 | Caul |
| 4,681,538 A | 7/1987 | DeLuca |
| 4,734,104 A | 3/1988 | Broberg |
| 4,737,163 A | 4/1988 | Larkey |
| 4,741,743 A | 5/1988 | Narayanan |
| 4,751,138 A | 6/1988 | Tumey |
| 4,800,685 A | 1/1989 | Haynes, Jr. |
| 4,898,597 A | 2/1990 | Hay |
| 4,991,362 A | 2/1991 | Heyer |
| 4,997,461 A | 3/1991 | Markhoff-Matheny |
| 5,011,410 A | 4/1991 | Culler |
| 5,037,453 A | 8/1991 | Narayanan |
| 5,152,917 A | 10/1992 | Pieper |

(Continued)

FOREIGN PATENT DOCUMENTS

| | | |
|---|---|---|
| CN | 1107772 A | 9/1995 |
| CN | 1348404 A | 5/2002 |

(Continued)

OTHER PUBLICATIONS

Bredereck, "Autoxidation of CH-active Polymerization Initiators XIV Report: Polymerizations and Polymerization Inhibitors", Macromolecular Chemistry, 1966, vol. 99, No. 2304, pp. 96-102.
Rosen, "Single-Electron Transfer and Single-Electron Transfer Degenerative Chain Transfer Living Radical Polymerization", Chem. Rev., 2009, vol. 109, pp. 5069-5119.
International Search Report for PCT Application No. PCT/US2014/041109 dated Aug. 21 2014, 5 pages.
Extended European Search Report, EP14818505.1 (PCTUS2014/041109), dated Feb. 3, 2017, 3 pages.

*Primary Examiner* — Pegah Parvini
(74) *Attorney, Agent, or Firm* — Bradford B. Wright (57) ABSTRACT

A method of making abrasive particles includes exposing ceramic particles to an organosilane-derived plasma formed from components comprising an organosilane and oxygen to form plasma-modified ceramic particles; and contacting a coupling agent with the second plasma-treated ceramic particle to provide the abrasive particle. Abrasive particles preparable by the method and abrasive particles containing them are also disclosed.

6 Claims, 1 Drawing Sheet

(56) References Cited

U.S. PATENT DOCUMENTS

| | | | |
|---|---|---|---|
| 5,164,348 A * | 11/1992 | Wood | C01F 7/02 501/1 |
| 5,203,884 A | 4/1993 | Buchanan | |
| 5,250,085 A * | 10/1993 | Mevissen | C09K 3/1409 51/293 |
| 5,252,629 A | 10/1993 | Imai | |
| 5,378,251 A | 1/1995 | Culler | |
| 5,436,063 A | 7/1995 | Follett | |
| 5,443,906 A | 8/1995 | Pihl | |
| 5,496,386 A | 3/1996 | Broberg | |
| 5,520,711 A | 5/1996 | Helmin | |
| 5,591,239 A | 1/1997 | Larson | |
| 5,593,467 A * | 1/1997 | Monroe | B24D 3/14 501/153 |
| 5,609,706 A | 3/1997 | Benedict | |
| 5,679,067 A | 10/1997 | Johnson | |
| 5,681,361 A | 10/1997 | Sanders, Jr. | |
| 5,712,210 A | 1/1998 | Windisch | |
| 5,858,140 A | 1/1999 | Berger | |
| 5,863,308 A | 1/1999 | Qi | |
| 5,888,594 A | 3/1999 | David | |
| 5,903,951 A | 5/1999 | Ionta | |
| 5,928,070 A | 7/1999 | Lux | |
| 5,948,166 A | 9/1999 | David | |
| 5,961,674 A | 10/1999 | Gagliardi | |
| 5,975,988 A | 11/1999 | Christianson | |
| 6,015,597 A * | 1/2000 | David | B01J 2/006 427/122 |
| 6,017,831 A | 1/2000 | Beardsley | |
| 6,054,093 A | 4/2000 | Torre, Jr. | |
| 6,552,140 B1 | 4/2003 | Kneafsey | |
| 7,195,360 B2 | 3/2007 | Bacon, Jr. | |
| 7,300,479 B2 | 11/2007 | McArdle | |
| 7,887,889 B2 | 2/2011 | David | |
| 8,080,073 B2 | 12/2011 | David | |
| 9,180,573 B2 | 11/2015 | Givot | |
| 2002/0134026 A1 | 9/2002 | Fujii | |
| 2009/0163127 A1 * | 6/2009 | David | B24D 11/001 451/486 |
| 2009/0165394 A1 | 7/2009 | Culler | |
| 2009/0192239 A1 | 7/2009 | Hecht | |
| 2009/0235591 A1 | 9/2009 | Yener | |
| 2009/0260297 A1 | 10/2009 | Seth et al. | |
| 2010/0146867 A1 | 6/2010 | Boden | |
| 2010/0151195 A1 | 6/2010 | Culler | |
| 2010/0151196 A1 | 6/2010 | Adefris | |
| 2010/0151201 A1 | 6/2010 | Erickson | |
| 2010/0242958 A1 | 9/2010 | Jinks | |
| 2010/0247932 A1 | 9/2010 | Jinks | |
| 2010/0255254 A1 | 10/2010 | Culler | |
| 2011/0219703 A1 | 9/2011 | Fuchs | |
| 2011/0244769 A1 | 10/2011 | David | |
| 2011/0305874 A1 | 12/2011 | Thoumazet | |
| 2013/0337725 A1 | 12/2013 | Monroe | |

FOREIGN PATENT DOCUMENTS

| | | |
|---|---|---|
| EP | 1645586 | 4/2006 |
| GB | 1293209 | 10/1972 |
| GB | 2116992 | 10/1983 |
| JP | 2000-265160 | 9/2000 |
| JP | 2003-520283 A | 7/2003 |
| JP | 2005-255654 | 9/2005 |
| KR | 2013-0006636 | 1/2013 |
| WO | WO 00/64633 | 11/2000 |
| WO | WO 01/04226 A2 | 1/2001 |
| WO | WO 2008-128849 | 10/2008 |
| WO | WO 2013-003213 | 1/2013 |
| WO | WO 2013-126377 | 8/2013 |
| WO | WO 2014-151650 | 12/2014 |

* cited by examiner

ABRASIVE PARTICLES, METHOD OF MAKING ABRASIVE PARTICLES, AND ABRASIVE ARTICLES

TECHNICAL FIELD

The present disclosure relates abrasive particles, methods of making abrasive particles, and abrasive articles.

BACKGROUND

Coupling agents are chemical compounds capable of reacting to form chemical bonds with both the reinforcement and the resin matrix of a composite material. It may also bond inorganic fillers or fibers to organic resins to form or promote a stronger bond at the interface. Coupling agents may be applied in solution or gas phase to the reinforcement, added to the resin, or both. The coupling agent acts as the interface between resin and mineral to form a chemical bridge between the two. The most common classes of coupling agents are silane coupling agents (e.g., organotrialkoxysilanes), titanates, zirconates, and organic acid-chromium chlorides coordination complexes.

Coupling agents are commonly used in the manufacture of abrasive articles (e.g., coated abrasive articles, resin-boned abrasive articles, and nonwoven abrasive articles) to chemically bond the abrasive mineral and filler to the polymeric binder resin.

However, various inadequacies may exist when using coupling agents with common abrasive minerals, typically in the form of abrasive grain or abrasive particles. For example, the bonding strength between the mineral and the resin may be insufficient for use conditions, resulting in premature loss of abrasive grain in a phenomenon known as shelling. Further, coupling agents may not be suitable for use with abrasive grain (e.g., diamond and cubic boron nitride) that has few if any reactive groups on its surface.

There remains a need for methods and materials that increase the bonding between abrasive grain and binder resin in abrasive articles.

SUMMARY

The present disclosure improves the bonding effectiveness of various coupling agents to abrasive particles by providing a surface coating on the abrasive particles that has a relatively high level of hydroxyl groups that are available for chemical bonding with common classes of coupling agents (especially including organosilane coupling agents).

In one aspect, the present disclosure provides a method of making abrasive particles, the method comprising steps:

a) exposing first ceramic particles to an organosilane-derived plasma formed from components comprising an organosilane and oxygen to form a plasma-modified ceramic particle, wherein the organosilane-derived plasma is essentially free of fluorine; and b) contacting a coupling agent with the plasma-modified ceramic particles to provide the abrasive particle.

In some embodiments, the method may be further enhanced by, before step a), exposing second ceramic particles to a oxygen plasma to form the first ceramic particle.

In another aspect, the present disclosure provides abrasive particles, each abrasive particle comprising:

a ceramic core, wherein the ceramic core does not comprise silica;

a shell layer at least partially enclosing the ceramic core, wherein the shell layer comprises silicon, oxygen, and hydrogen, and wherein the shell layer comprises silanol groups; and at least one residue formed by condensation of a coupling agent with at least a portion of the silanol groups.

In yet another aspect, the present disclosure provides an abrasive article comprising abrasive particles according the present disclosure.

As used herein, the term "ceramic" refers to any material containing at least 90 percent by weight, preferably at least 95 percent by weight, more preferably at least 99 percent by weight, or even 100 percent by weight, of ceramic and/or glass-ceramic material.

Features and advantages of the present disclosure will be further understood upon consideration of the detailed description as well as the appended claims.

Repeated use of reference characters in the specification and drawings is intended to represent the same or analogous features or elements of the disclosure. It should be understood that numerous other modifications and embodiments can be devised by those skilled in the art, which fall within the scope and spirit of the principles of the disclosure. The figures may not be drawn to scale.

DETAILED DESCRIPTION

Methods of making an abrasive particle according to the present disclosure include a step in which ceramic particles are exposed to a plasma formed from components comprising organosilane and oxygen. Preferably, the ceramic particles suitably sized for use as abrasive particles, although this is not a requirement. As used herein, the term "abrasive particles" refers to particles with a Mohs hardness of at least 4 and of a size distribution suitable for use in abrasive articles and/or processes.

The ceramic particles may comprise, for example, alumina (e.g., including heat-treated aluminum oxide, white fused aluminum oxide, brown fused aluminum oxide, monocrystalline fused aluminum oxide, sintered sol-gel-derived aluminas, sol-gel aluminum nitride/aluminum oxynitride, and sintered bauxite), silicon carbide, alumina-zirconia, aluminoxynitride, ceria, boron suboxide, garnet, tripoli, flint, diamond (e.g., including natural and synthetic diamond), and cubic boron nitride (cBN). In one embodiment, the abrasive material may include cubic boron nitride, diamond, alumina, silicon carbide, or a combination thereof. The ceramic particles may be randomly shaped (e.g., crushed particles) or precisely-shaped (e.g., having a shape corresponding to a mold used in forming them by a sol-gel process). In some embodiments, the ceramic particle (and hence the ceramic core) does not comprise silica. Combinations of different ceramic particle compositions and/or shapes may be used in processes according to the present disclosure.

The plasma formed from components comprising an organosilane and oxygen, may be prepared by known methods; for example, as described in U.S. Pat. No. 8,080,073 (Moses et al.). The plasma is essentially free of fluorine containing components. That is, the plasma contains less than 1 weight percent of fluorine, preferably less than 0.1 weight percent of fluorine, more preferably less than 0.01 weight percent of fluorine, even more preferably less than 0.001 weight percent of fluorine, even more preferably less than 0.0001 weight percent of fluorine, or is completely free of fluorine.

The organosilane is preferably chosen to have sufficient vapor pressure that it can be handled by gas transport techniques, although this is not a requirement. Preferably, the organosilane is composed of silicon, carbon, hydrogen, and optionally oxygen atoms, although other organosilanes may also be used. Examples of suitable oganosilanes include: tetramethylsilane(TMS); methylsilane; dimethylsilane; trimethylsilane; ethylsilane; tetraethyl orthosilicate (TEOS); tetramethylcyclotetrasiloxane (TMCTS); disilanomethane; bis(methylsilano)methane; 1,2-disilanoethane; 1,2-bis(methylsilano)ethane; 2,2-disilanopropane; diethylsilane; diethylmethylsilane; propylsilane; vinylmethylsilane; divinyldimethylsilane; 1,1,2,2-tetramethyldisilane; hexamethyldisilane; 1,1,2,2,3,3-hexamethyltrisilane; 1,1,2,3,3-pentamethyltrisilane; dimethyldisilanoethane; dimethyldisilanopropane; tetramethyldisilanoethane; tetramethyldisilanopropane; and combinations thereof. Preferably, the organosilane is tetramethylsilane. In some embodiments, the organosilane comprises an organosiloxane such as, for example, hexamethyldisiloxane, tetramethyldisiloxane, polydimethydisiloxane, and combinations thereof.

Generally such plasmas may be prepared by feeding the organosilane, and oxygen, and optionally an inert gas into the processing chamber of a plasma generating device under conditions such that a plasma is formed. The resultant plasma-modified ceramic particles have a silicate layer comprising silicon, oxygen, and hydrogen on their exterior surface. Preferably, the silicate layer is substantially uniform and/or complete over the surfaces of the ceramic particles.

Typical plasma reactors have a process chamber in which the plasma is formed and exposed to the article being plasma-modified. The chamber operates at low pressure and contains electrical components (e.g., electrodes) and gas handling controls to form and control the plasma.

During plasma treatment, plasma created in the reactor from the gas within the process chamber is generated and sustained by supplying power (e.g., from a radiofrequency (RF) generator operating at a frequency in the range of 0.001 to 100 MHz) to at least one electrode. The electrode system may be symmetric or asymmetric. In some plasma apparatus, electrode surface area ratios between grounded and powered electrodes are from 2:1 to 4:1, or from 3:1 to 4:1. The powered electrode may be cooled, e.g., with water. Plasma deposition may be achieved, for example, by placing the particles in direct contact with the smaller electrode of an asymmetric electrode configuration. This allows the particles to act as electrodes due to capacitive coupling between the powered electrode and the particles. Agitation of the ceramic particles may be helpful to ensure a substantially complete and/or uniform deposition of the shell layer.

The RF power source provides power at a typical frequency in the range of 0.01 to 50 MHz, or 13.56 MHz or any whole number (e.g., 1, 2, or 3) multiple thereof. The RF power source can be an RF generator such as a 13.56 MHz oscillator. To obtain efficient power coupling (i.e., wherein the reflected power is a small fraction of the incident power), the power source may be connected to the electrode via a network that acts to match the impedance of the power supply with that of the transmission line (which is usually 50 ohms reactive) so as to effectively transmit RF power through a coaxial transmission line. One type of matching network, which includes two variable capacitors and an inductor, is available under the designation AMN 3000 from Plasmatherm, St. Petersburg, Fla. Traditional methods of power coupling involve the use of a blocking capacitor in the impedance matching network between the powered electrode and the power supply. This blocking capacitor prevents the DC bias voltage from being shunted out to the rest of the electrical circuitry. Instead, the DC bias voltage is shunted out in a grounded electrode. While the acceptable frequency range from the RF power source may be high enough to form a large negative DC self bias on the smaller electrode, it should not be so high that it creates standing waves in the resulting plasma, which is inefficient for plasma treatment.

The plasma is formed from components comprising oxygen, organosilane, and an optional inert gas (e.g., helium, neon, argon, or xenon). The feed ratio of organosilane to oxygen, on a weight basis, into the process chamber of the plasma reactor is typically between about 0.05 and about 0.35, preferably between about 0.05 to about 0.25. Power and duration of exposure may be adjusted to determine the thickness of the applied coating.

Typically, the plasma-treatment contact time is form about 0.1 minute to about 10 minutes, preferably from about 0.1 minute to about 2 minutes. Exemplary process conditions for batch treatment plasma deposition of the abrasive particles with TMS are as follows: TMS flow rate of about 150 sccm; oxygen flow rate of about 500 sccm; pressure of about 75 mTorr (7300 mPa); radiofrequency (RF) power density of about 1000 watts; and plasma treatment time of about 600 seconds.

In addition to batch treatment of the ceramic particles the particles may be placed on conveyor webs and processed continuously; e.g., using techniques described in U.S. Pat. No. 5,888,594 (David et al.); U.S. Pat. No. 5,948,166 (David et al.); U.S. Pat. No. 7,195,360 (Bacon, Jr. et al.), and U.S. Pat. No. 7,887,889 (David et al.). A continuous plasma treatment apparatus typically includes a rotating drum electrode which may be powered by an RF power source, a grounded chamber which acts as a grounded electrode, a feed reel which continuously supplies to-be-treated articles in the form of a continuous moving web, and a take-up reel which collects the treated article. The feed and take up reels are optionally enclosed within the chamber, or can be operated outside of the chamber as long as a low-pressure plasma can be maintained within the chamber. If desired, a concentric grounded electrode can be added near the powered drum electrode for additional spacing control. A mask can be employed if desired to provide discontinuous treatment. An inlet supplies suitable treatment gases in vapor or liquid form to the chamber.

The result of the above process is particles having a ceramic core and at least partially enclosed by a plasma-deposited shell layer.

Preferably, the plasma-deposited a shell layer at least partially enclosing has a thickness of from 1 nm to 1000 nm thick, more preferably from 1 nm to 100 nm thick, and more preferably from 50 to 100 nm thick, although other thicknesses may also be used. The shell layer at least partially encloses the ceramic core, preferably In an optional pre-treatment step, the ceramic particles may be exposed to an oxygen plasma prior to being exposed to the plasma formed from components comprising an organosilane and oxygen discussed above. This step may serve, for example, to remove any organic material (e.g., contaminants) from the surface of the ceramic particles that might otherwise interfere with the formation of the shell layer, or its adhesion to the ceramic core.

The shell layer comprises silicate material having silanol groups (i.e., Si—OH groups). The silanol groups are reactive to the coupling agent to form the abrasive particles. Exemplary coupling agents include organosilanes, titanates, and zirconates, although other coupling agents may be used. Typically, brief contact of the coupling agent with the shell layer is sufficient to cause chemical reaction forming chemical bonds; however, extended contact time and/or heating may also be used. The coupling agent may be diluted with an organic solvent that is not reactive to the coupling agent (e.g., tetrahydrofuran, toluene, or dichloromethane). The amount of coupling agent used should be sufficient to form the shell layer, preferably at the thicknesses specified hereinabove.

Organosilanes are particularly useful coupling agents as they are both reactive to silanol groups and readily available from commercial suppliers in a wide variety of forms. In some embodiments, the coupling agent comprises an organosilane coupling agent represented by the formula:

$$R^1-SiY_3$$

wherein $R^1$ is an monovalent organic group and each Y is independently a hydrolyzable group. In some embodiments, $R^1$ has from 2 to 18 carbon atoms. In some embodiments, $R^1$ has from 3 to 12 carbon atoms and is selected from the group consisting of epoxyalkyl groups, hydroxyalkyl groups, carboxyalkyl groups, aminoalkyl groups, acryloxyalkyl groups, and methacryloxyalkyl groups. In some embodiments, each Y is independently selected from the group consisting of —Cl, —Br, —OC(=O)$R^2$, and O$R^2$, wherein $R^2$ represents an alkyl group having from 1 to 4 carbon atoms.

Suitable silane coupling agents include, for example, those identified in U.S. Pat. No. 3,079,361 (Plueddemann). Specific examples include: (3-acryloxypropyl)trimethoxysilane, N-(2-aminoethyl)-3-aminopropyltrimethoxysilane, 3-aminopropyltriethoxysilane, 3-aminopropyltrimethoxysilane, (3-glycidoxypropyl)trimethoxysilane, 3-mercaptopropyltrimethoxysilane, 3-methacryloxypropyltrimethoxysilane, vinyltrimethoxysilane (all available from Gelest, Inc., Morrisville, Pa.), and those available under the trade designation "XIAMETER" from Dow Corning Corp., Midland, Mich. such as vinylbenzylaminoethylaminopropyltrimethoxysilane (supplied as 40% in methanol, XIAMETER OFS-6032 SILANE), chloropropyltrimethoxysilane (XIAMETER OFS-6076 SILANE), and aminoethylaminopropyltrimethoxysilane (XIAMETER OFS-6094 SILANE).

Suitable titanate coupling agents include, for example, those identified in U.S. Pat. No. 4,473,671 (Green). Specific examples include isopropyl triisostearoyl titanate, isopropyl tri(lauryl-myristyl) titanate, isopropyl isostearoyl dimethacryl titanate; isopropyl tri(dodecyl-benzenesulfonyl) titanate, isopropyl isostearoyl diacryl titanate, isopropyl tri(diisooctyl phosphato) tri(dioctylpyrophosphato) titanate, isopropyl triacryloyl titanate, and diisopropxy(ethoxyacetoacetyl) titanate, tetra(2,2-diallyloxymethyl)butyl di(ditridecyl)phosphito titanate (available as KR 55 from Kenrich Petrochemicals, Inc. (hereinafter Kenrich) Bayonne, N.J.), neopentyl(diallyl)oxy trineodecanonyl titanate (available as LICA 01 from Kenrich), neopentyl(diallyl)oxy tri(dodecyl) benzenesulfonyl titanate (available as LICA 09 from Kenrich), neopentyl(diallyl)oxy tri(dioctyl)phosphato titanate (available as LICA 12 from Kenrich), neopentyl(dially)oxy tri(dioctyl)pyro-phosphato titanate (available as LICA38 from Kenrich), neopentyl(diallyl)oxy tri(N-ethylenediamino)ethyl titanate (available as LICA 44 from Kenrich), neopentyl(diallyl)oxy tri(m-amino)phenyl titanate (available as LICA 97 from Kenrich), and neopentyl(diallyl)oxy trihydroxy caproyl titanate (formerly available as LICA 99 from Kenrich.

Suitable zirconate coupling agents include, for example, those identified in U.S. Pat. No. 4,539,048 (Cohen). Specific examples include zirconium propionate, tetra(2,2-diallyloxymethyl)butyl di(ditridecyl)phosphito zirconate (available as KZ 55 from Kenrich), neopentyl(diallyl)oxy trineodecanoyl zirconate (available as NZ 01 from Kenrich), neopentyl(diallyl)oxy tri(dodecyl)benzenesulfonyl zirconate (available as NZ 09 from Kenrich), neopentyl(diallyl)oxy tri(dioctyl)phosphato zirconate (available as NZ 12 from Kenrich), neopentyl(diallyl)oxy tri(dioctyl)pyrophosphato zirconate (available as NZ 38 from Kenrich), neopentyl (diallyl)oxy tri(N-ethylenediamino)ethyl zirconate (available as NZ 44 from Kenrich), neopentyl(diallyl)oxy tri(m-amino)phenyl zirconate (available as NZ 97 from Kenrich), neopentyl(diallyl)oxy trimethacryl zirconate (available as NZ 33 from Kenrich), neopentyl(diallyl)oxy triacryl zirconate (formerly available as NZ 39 from Kenrich), dineopentyl (diallyl)oxy di(para-aminobenzoyl) zirconate (available as NZ 37 from Kenrich), and dineopentyl(diallyl)oxy di(3-mercapto)propionic zirconate (available as NZ 66A from Kenrich).

Mixtures of one or more coupling agents may be used, although typically a single coupling agent is sufficient.

Reaction of the coupling agent with Si—OH groups in the shell layer results in formation of residues (i.e., a chemical residue) formed by condensation of a coupling agent with at least a portion of the silanol groups. In some embodiments, the residues are represented by the trivalent formula wherein $R^1$ is as previously defined. The abrasive particles which result from the reaction of the coupling agent with Si—OH groups in the shell layer may be used without further manipulation and/or modification (i.e., "as is") or they may be further modified and/or size graded. Preferably, they are used "as is".

The ceramic particles and/or abrasive particles according to the present disclosure, and especially crushed ceramic particles and abrasive particle made from them according to the present disclosure can be screened and graded using techniques well known in the art including, for example, the use of an abrasives industry recognized grading standards such as ANSI (American National Standard Institute), FEPA (Federation of European Producers of Abrasives), and JIS (Japanese Industrial Standard). Abrasive particles according to the present disclosure may be used in a wide range of particle sizes, typically ranging in size from about 0.1 to about 5000 micrometers, more typically from about one to about 2000 micrometers; preferably from about 5 to about 1500 micrometers, more preferably from about 100 to about 1500 micrometers.

ANSI grade designations include: ANSI 4, ANSI 6, ANSI 8, ANSI 16, ANSI 24, ANSI 36, ANSI 40, ANSI 50, ANSI 60, ANSI 80, ANSI 100, ANSI 120, ANSI 150, ANSI 180, ANSI 220, ANSI 240, ANSI 280, ANSI 320, ANSI 360, ANSI 400, and ANSI 600. FEPA grade designations include P8, P12, P16, P24, P36, P40, P50, P60, P80, P100, P120, P150, P180, P220, P320, P400, P500, P600, P800, P1000, and P1200. JIS grade designations include JIS8, JIS12, JIS16, JIS24, JIS36, JIS46, JIS54, JIS60, JIS80, JIS100, JIS150, JIS180, JIS220, JIS240, JIS280, JIS320, JIS360, JIS400, JIS400, JIS600, JIS800, JIS1000, JIS1500, JIS2500, JIS4000, JIS6000, JIS8000, and JIS10,000.

Abrasive particles according to the present disclosure may have non-random and/or precise shapes, generally imparted by the method used to form them. For example, abrasive particles according to the present disclosure may be shaped as pyramids, truncated pyramids, rods, or cones. Ceramic particles used in practice methods according to the present disclosure can be made by extrusion or screen printing of a sol-gel mixture (e.g., as described in U.S. Pat. No. 6,054,093 (Torre, Jr. et al)), or by a sol-gel molding process using a production tool (i.e., mold) as described in, for example, U.S. Patent Appln. Publ. Nos. 2010/0146867 A1 (Boden et al.); 2010/0151195A1 (Culler et al.); 2010/0151196 A1 (Adefris et al.); 2009/0165394 A1 (Culler et al.); and 2010/0151201A1 (Erickson et al.). In these methods it may be desirable to include a mold release compound in the initial dispersion, or to coat the mold release onto the mold surface, to aid in removing the particles from the mold if desired. Typical mold release agents include oils such as peanut oil or mineral oil, fish oil, silicones, polytetrafluoroethylene, zinc stearate, and graphite.

In another aspect, the present disclosure provides an abrasive article (e.g., coated abrasive articles, bonded abrasive articles (including resinoid bonded grinding wheels and cut-off wheels, mounted points, and honing stones), nonwoven abrasive articles, and abrasive brushes) comprising a binder and a plurality of abrasive particles, wherein at least a portion of the abrasive particles are abrasive particles (including where the abrasive particles are agglomerated) according to the present disclosure. Methods of making such abrasive articles and using abrasive articles are well known to those skilled in the art.

Coated abrasive articles generally include a backing, abrasive particles, and at least one binder to hold the abrasive particles onto the backing. Examples of suitable backing materials include woven fabric, polymeric film, vulcanized fiber, a nonwoven fabric, a knit fabric, paper, combinations thereof, and treated versions thereof. The binder can be any suitable binder, including an inorganic or organic binder (including thermally curable resins and radiation curable resins). The abrasive particles can be present in one layer or in two layers of the coated abrasive article.

Figure 1:
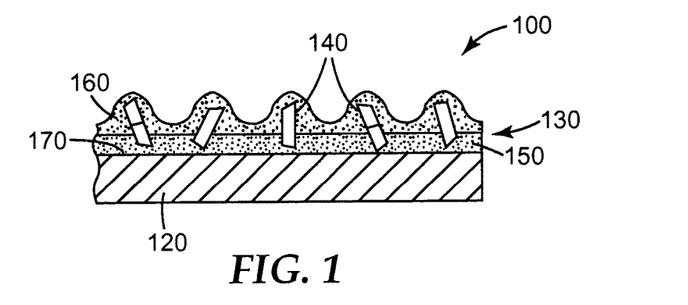
FIG. 1 is a schematic cross-sectional view of an exemplary coated abrasive article including abrasive particles according to the present disclosure.

An exemplary embodiment of a coated abrasive article according to the present disclosure is depicted in FIG. 1. Referring to FIG. 1, coated abrasive article 100 has a backing 120 and abrasive layer 130. Abrasive layer 130 includes abrasive particles 140 according to the present disclosure secured to a major surface 170 of backing 120 (substrate) by make coat 150 and size coat 160. Additional layers, for example, such as an optional supersize layer (not shown) that is superimposed on the size layer, or a backing antistatic treatment layer (not shown) may also be included, if desired.

Figure 2:
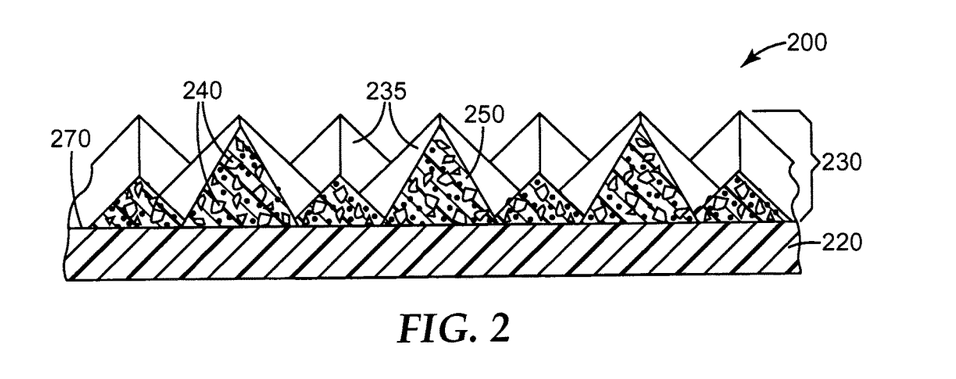
FIG. 2 is a schematic cross-sectional view of another exemplary coated abrasive article including abrasive particles according to the present disclosure.

Another exemplary a coated abrasive article according to the present disclosure is depicted in FIG. 2. Referring to FIG. 2, exemplary coated abrasive article 200 has a backing 220 (substrate) and structured abrasive layer 230. Structured abrasive layer 230 includes a plurality of shaped abrasive composites 235 comprising abrasive particles 240 according to the present disclosure dispersed in a binder material 250 secured to a major surface 270 of backing 220.

Coated abrasive articles according to the present disclosure may include additional layers such as, for example, an optional supersize layer that is superimposed on the abrasive layer, or a backing antistatic treatment layer may also be included, if desired.

Further details regarding coated abrasive articles can be found, for example, in U.S. Pat. No. 4,734,104 (Broberg); U.S. Pat. No. 4,737,163 (Larkey); U.S. Pat. No. 5,203,884 (Buchanan et al.); U.S. Pat. No. 5,152,917 (Pieper et al.); U.S. Pat. No. 5,378,251 (Culler et al.); U.S. Pat. No. 5,436,063 (Follett et al.); U.S. Pat. No. 5,496,386 (Broberg et al.); U.S. Pat. No. 5,609,706 (Benedict et al.); U.S. Pat. No. 5,520,711 (Helmin); U.S. Pat. No. 5,961,674 (Gagliardi et al.), and U.S. Pat. No. 5,975,988 (Christianson).

Resinoid bonded abrasive articles typically include a shaped mass of abrasive particles held together by an organic binder. Such shaped mass can be, for example, in the form of a wheel such as a grinding wheel or cutoff wheel. The diameter of grinding wheels typically is about one cm to over one meter; the diameter of cut off wheels about one cm to over 200 cm (more typically 3 cm to about 50 cm). The cut off wheel thickness is typically about 0.5 mm to about 5 cm, more typically about 0.5 mm to about 2 cm. The shaped mass can also be in the form, for example, of a honing stone, segment, mounted point, disc, or other conventional bonded abrasive shape. Bonded abrasive articles typically comprise about 3 to 50 percent by volume of bond material, about 30 to 90 percent by volume abrasive particles (or abrasive particle blends), up to 50 percent by volume additives (including grinding aids), and up to 70 percent by volume pores, based on the total volume of the bonded abrasive article.

Figure 3:
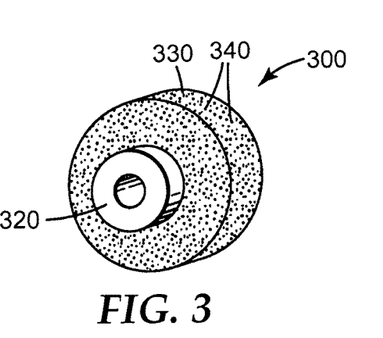
FIG. 3 is a schematic perspective view of an exemplary bonded abrasive article including abrasive particles according to the present disclosure.

An exemplary form is a grinding wheel. Referring to FIG. 3, grinding wheel 300 according to the present disclosure includes abrasive particles 340 according to the present disclosure, retained by a binder material 330, molded into a wheel, and mounted on hub 320.

Further details regarding bonded abrasive articles can be found, for example, in U.S. Pat. No. 4,543,107 (Rue); U.S. Pat. No. 4,741,743 (Narayanan et al.); U.S. Pat. No. 4,800,685 (Haynes et al.); U.S. Pat. No. 4,898,597 (Hay et al.); U.S. Pat. No. 4,997,461 (Markhoff-Matheny et al.); U.S. Pat. No. 5,037,453 (Narayanan et al.); and U.S. Pat. No. 5,863,308 (Qi et al.).

Figure 4:
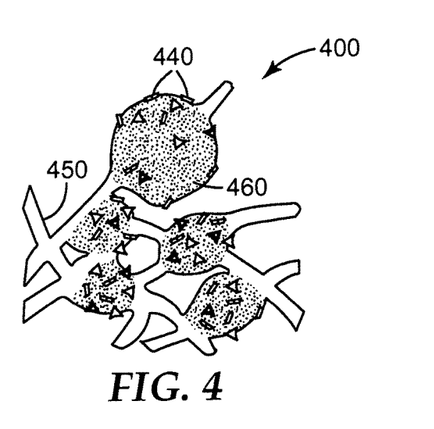
FIG. 4 is an enlarged schematic view of a nonwoven abrasive article including abrasive particles according to the present disclosure.

Nonwoven abrasive articles typically include an open porous lofty polymer filament structure having abrasive particles according to the present disclosure distributed throughout the structure and adherently bonded therein by an organic binder. Examples of filaments include polyester fibers, polyamide fibers, and polyaramid fibers. In FIG. 4, a schematic depiction, enlarged about 100×, of an exemplary nonwoven abrasive article 400 according to the present disclosure is provided. Such a nonwoven abrasive article according to the present disclosure comprises a lofty open nonwoven fiber web 450 (substrate) onto which abrasive particles 440 according to the present disclosure are adhered by binder material 460.

Further details regarding nonwoven abrasive articles can be found, for example, in U.S. Pat. No. 2,958,593 (Hoover et al.); U.S. Pat. No. 4,227,350 (Fitzer); U.S. Pat. No. 4,991,362 (Heyer et al.); U.S. Pat. No. 5,712,210 (Windisch et al.); U.S. Pat. No. 5,591,239 (Edblom et al.); U.S. Pat. No. 5,681,361 (Sanders); U.S. Pat. No. 5,858,140 (Berger et al.); U.S. Pat. No. 5,928,070 (Lux); and U.S. Pat. No. 6,017,831 (Beardsley et al.).

Useful abrasive brushes include those having a plurality of bristles unitary with a backing (see, e.g., U.S. Pat. No. 5,443,906 (Pihl et al.); U.S. Pat. No. 5,679,067 (Johnson et al.); and U.S. Pat. No. 5,903,951 (Ionta et al.). Preferably, such brushes are made by injection molding a mixture of polymer and abrasive particles.

Suitable binder materials include organic binders such as, for example, thermosetting organic polymers. Examples of suitable thermosetting organic polymers include phenolic resins, urea-formaldehyde resins, melamine-formaldehyde resins, urethane resins, acrylate resins, polyester resins, aminoplast resins having pendant alpha, beta-unsaturated carbonyl groups, epoxy resins, acrylated urethane, acrylated epoxies, and combinations thereof. The binder and/or abrasive article may also include additives such as, for example, fibers, lubricants, wetting agents, thixotropic materials, surfactants, pigments, dyes, antistatic agents (e.g., carbon black, vanadium oxide, graphite), coupling agents (e.g., to coupling with diluent abrasive particles not treated according to the present disclosure), plasticizers, and suspending agents. The amounts of these optional additives are selected to provide the preferred properties. The coupling agents can improve adhesion to the abrasive particles and/or filler. The binder chemistry may be thermally cured, radiation cured or combinations thereof. Additional details on binder chemistry may be found in U.S. Pat. No. 4,588,419 (Caul et al.); U.S. Pat. No. 4,751,138 (Tumey et al.); and U.S. Pat. No. 5,436,063 (Follett et al.).

Binder materials may also contain filler materials or grinding aids, typically in the form of a particulate material. Typically, the particulate materials are inorganic materials. Examples of useful fillers for this disclosure include: metal carbonates (e.g., calcium carbonate (e.g., chalk, calcite, marl, travertine, marble and limestone), calcium magnesium carbonate, sodium carbonate, magnesium carbonate), silica (e.g., quartz, glass beads, glass bubbles and glass fibers) silicates (e.g., talc, clays, (montmorillonite) feldspar, mica, calcium silicate, calcium metasilicate, sodium aluminosilicate, sodium silicate) metal sulfates (e.g., calcium sulfate, barium sulfate, sodium sulfate, aluminum sodium sulfate, aluminum sulfate), gypsum, vermiculite, wood flour, aluminum trihydrate, carbon black, metal oxides (e.g., calcium oxide (lime), aluminum oxide, titanium dioxide), and metal sulfites (e.g., calcium sulfite).

In general, the addition of a grinding aid increases the useful life of the abrasive article. A grinding aid is a material that has a significant effect on the chemical and physical processes of abrading, which results in improved performance. Grinding aids encompass a wide variety of different materials and can be inorganic or organic based. Examples of chemical groups of grinding aids include waxes, organic halide compounds, halide salts and metals and their alloys. The organic halide compounds will typically break down during abrading and release a halogen acid or a gaseous halide compound. Examples of such materials include chlorinated waxes like tetrachloronaphthalene, pentachloronaphthalene, and polyvinyl chloride. Examples of halide salts include sodium chloride, potassium cryolite, sodium cryolite, ammonium cryolite, potassium tetrafluoroborate, sodium tetrafluoroborate, silicon fluorides, potassium chloride, and magnesium chloride. Examples of metals include, tin, lead, bismuth, cobalt, antimony, cadmium, and iron titanium. Other miscellaneous grinding aids include sulfur, organic sulfur compounds, graphite, and metallic sulfides. A combination of different grinding aids may be used, and in some instances this may produce a synergistic effect.

Grinding aids can be particularly useful in coated abrasive and bonded abrasive articles. In coated abrasive articles, grinding aid is typically used in the supersize coat, which is applied over the surface of the abrasive particles. Sometimes, however, the grinding aid is added to the size coat. Typically, the amount of grinding aid incorporated into coated abrasive articles are about 50-300 g/m$^2$ (preferably, about 80-160 g/m$^2$). In vitrified bonded abrasive articles grinding aid is typically impregnated into the pores of the article.

The abrasive articles can contain 100 percent abrasive particles according to the present disclosure, or blends of such abrasive particles with other abrasive particles and/or diluent particles. However, at least about 2 percent by weight, preferably at least about 5 percent by weight, and more preferably about 30 percent to 100 percent by weight, of the abrasive particles in the abrasive articles should be abrasive particles according to the present disclosure.

In some instances, the abrasive particles according the present disclosure may be blended with another abrasive particles and/or diluent particles at a ratio between 5 and 75 percent by weight, about 25 to 75 percent by weight about 40 to 60 percent by weight, or about 50 to 50 percent by weight (i.e., in equal amounts by weight).

Examples of suitable conventional abrasive particles include fused aluminum oxide (including white fused alumina, heat-treated aluminum oxide and brown aluminum oxide), silicon carbide, boron carbide, titanium carbide, diamond, cubic boron nitride, garnet, fused alumina-zirconia, and sol-gel-derived abrasive particles, and the like. The conventional sol-gel-derived abrasive particles may be seeded or non-seeded. Likewise, they may be randomly shaped or have a shape associated with them, such as a rod or a triangle. In some instances, blends of abrasive particles may result in an abrasive article that exhibits improved grinding performance in comparison with abrasive articles comprising 100 percent of either type of abrasive particle.

If there is a blend of abrasive particles, the abrasive particle types forming the blend may be of the same size. Alternatively, the abrasive particle types may be of different particle sizes. For example, the larger sized abrasive particles may be abrasive particles according to the present disclosure, with the smaller sized particles being another abrasive particle type. Conversely, for example, the smaller sized abrasive particles may be abrasive particles according to the present disclosure, with the larger sized particles being another abrasive particle type.

Examples of suitable diluent particles include marble, gypsum, flint, silica, iron oxide, aluminum silicate, glass (including glass bubbles and glass beads), alumina bubbles, alumina beads, and diluent agglomerates.

Abrasive particles according to the present disclosure can also be combined in or with abrasive agglomerates. Abrasive agglomerate particles typically comprise a plurality of abrasive particles, a binder, and optional additives. The binder may be organic and/or inorganic. Abrasive agglomerates may be randomly shape or have a predetermined shape associated with them. The shape may be, for example, a block, cylinder, pyramid, coin, or a square. Abrasive agglomerate particles typically have particle sizes ranging from about 100 to about 5000 micrometers, typically about 250 to about 2500 micrometers.

The abrasive particles may be uniformly distributed in the abrasive article or concentrated in selected areas or portions of an abrasive article. For example, in a coated abrasive, there may be two layers of abrasive particles. The first layer comprises abrasive particles other abrasive particles according to the present disclosure, and the second (outermost) layer comprises abrasive particles according to the present disclosure. Likewise in a bonded abrasive, there may be two distinct sections of the grinding wheel. The outermost section may comprise abrasive particles according to the present disclosure, whereas the innermost section does not. Alternatively, abrasive particles according to the present disclosure may be uniformly distributed throughout the bonded abrasive article.

The present disclosure provides a method of abrading a workpiece. The method comprises: frictionally contacting abrasive particles according to the present disclosure with a surface of the workpiece, and moving at least one of the abrasive particles and the surface of the workpiece relative to the other to abrade at least a portion of the surface of the workpiece. Methods for abrading with abrasive particles according to the present disclosure include, for example, snagging (i.e., high-pressure high stock removal) to polishing (e.g., polishing medical implants with coated abrasive belts), wherein the latter is typically done with finer grades (e.g., ANSI 220 and finer) of abrasive particles. The abrasive particles may also be used in precision abrading applications such as grinding cam shafts with vitrified bonded wheels. The size of the abrasive particles used for a particular abrading application will be apparent to those skilled in the art.

Abrading may be carried out dry or wet. For wet abrading, the liquid may be introduced supplied in the form of a light mist to complete flood. Examples of commonly used liquids include: water, water-soluble oil, organic lubricant, and emulsions. The liquid may serve to reduce the heat associated with abrading and/or act as a lubricant. The liquid may contain minor amounts of additives such as bactericide, antifoaming agents, and the like.

Examples of workpieces include aluminum metal, carbon steels, mild steels (e.g., 1018 mild steel and 1045 mild steel), tool steels, stainless steel, hardened steel, titanium, glass, ceramics, wood, wood-like materials (e.g., plywood and particle board), paint, painted surfaces, organic coated surfaces and the like. The applied force during abrading typically ranges from about 1 to about 100 kilograms (kg), although other pressures can also be used.

SELECT EMBODIMENTS OF THE PRESENT DISCLOSURE

In a first embodiment, the present disclosure provides a method of making abrasive particles, the method comprising steps:

a) exposing first ceramic particles to an organosilane-derived plasma formed from components comprising an organosilane and oxygen to form a plasma-treated ceramic particle, wherein the organosilane-derived plasma is essentially free of fluorine; and b) contacting a coupling agent with the plasma-modified ceramic particles to provide the abrasive particle.

In a second embodiment, the present disclosure provides a method according to the first embodiment, further comprising, before step a):

exposing second ceramic particles to a oxygen plasma to form the first ceramic particles.

In a third embodiment, the present disclosure provides a method according to the first or second embodiment, wherein the organosilane comprises tetramethylsilane.

In a fourth embodiment, the present disclosure provides a method according to any one of the first to third embodiments, wherein the components further comprise inert gas selected from helium argon, xenon, and combinations thereof.

In a fifth embodiment, the present disclosure provides a method according to any one of the first to fourth embodiments, wherein the coupling agent comprises an organosilane coupling agent represented by the formula:

wherein $R^1$ is an monovalent organic group and each Y is independently a hydrolyzable group.

In a sixth embodiment, the present disclosure provides a method according to the fifth embodiments, wherein $R^1$ has from 3 to 12 carbon atoms and is selected from the group consisting of epoxyalkyl groups, hydroxyalkyl groups, carboxyalkyl groups, aminoalkyl groups, acryloxyalkyl groups, and methacryloxyalkyl groups.

In a seventh embodiment, the present disclosure provides a method according to the fifth embodiment, wherein each Y is independently selected from the group consisting of —Cl, —Br, —OC(=O)$R^2$, and O$R^2$, wherein $R^2$ represents an alkyl group having from 1 to 4 carbon atoms.

In an eighth embodiment, the present disclosure provides abrasive particles, each abrasive particle comprising:

a ceramic core, wherein the ceramic core does not comprise silica;

a shell layer at least partially enclosing the ceramic core, wherein the shell layer comprises silicon, oxygen, and hydrogen, and wherein the shell layer comprises silanol groups; and at least one residue formed by condensation of a coupling agent with at least a portion of the silanol groups.

In a ninth embodiment, the present disclosure provides abrasive particles according to the eighth embodiment, wherein the residue is represented by the formula wherein $R^1$ has from 3 to 12 carbon atoms and is selected from the group consisting of epoxyalkyl groups, hydroxyalkyl groups, carboxyalkyl groups, aminoalkyl groups, acryloxyalkyl groups, and methacryloxyalkyl groups.

In a tenth embodiment, the present disclosure provides abrasive particles according to the eighth or ninth embodiment, wherein the abrasive particles conform to an abrasives industry specified nominal grade.

In an eleventh embodiment, the present disclosure provides an abrasive article comprising abrasive particles according to any one of the eighth to tenth embodiments retained in an organic binder.

In a twelfth embodiment, the present disclosure provides an abrasive article according to the eleventh embodiment, wherein the abrasive article comprises a bonded abrasive article.

In a thirteenth embodiment, the present disclosure provides an abrasive article according to the eleventh embodiment, wherein the abrasive article comprises a coated abrasive article.

In a fourteenth embodiment, the present disclosure provides an abrasive article according to the eleventh embodiment, wherein the abrasive article comprises a nonwoven abrasive article.

Objects and advantages of this disclosure are further illustrated by the following non-limiting examples, but the particular materials and amounts thereof recited in these examples, as well as other conditions and details, should not be construed to unduly limit this disclosure.

EXAMPLES

Unless otherwise noted, all parts, percentages, ratios, etc. in the Examples and the rest of the specification are by weight.

The abbreviations in Table 1 (below) are used for materials throughout the Examples.

TABLE 1

| Abbreviation | Description |
|---|---|
| AP1 | FEPA grade P80 crushed ceramic abrasive grain, obtained from 3M, Saint Paul, Minnesota |
| AP2 | plasma-modified AP1, prepared as described below |
| AP3 | AP1 particles treated with 0.1 wt. % of A174, prepared as described below |
| AP4 | AP2 particles treated with 0.1 wt. % of A174, prepared as described below |
| AP5 | Shaped abrasive particle, prepared as described below |
| AP6 | Shaped abrasive particle, prepared as described below |
| AP7 | plasma-modified AP5, prepared as described below |
| AP8 | plasma-modified AP6, prepared as described below |
| AP9 | AP7 particles treated with 0.1 wt. % of A1100, prepared as described below |
| AP10 | AP8 particles treated with 0.1 wt. % of A1100, prepared as described below |
| TMS | tetramethylsilane, obtained as SIT7555.1 from Gelest Inc., Morrisville, Pennsylvania |
| A174 | γ-methacryloxypropyltrimethoxysilane, obtained as SILQUEST A-174 from Momentive Performance Materials, Columbus, Ohio |
| A1100 | γ-aminopropyltrimethoxysilane, obtained as SILQUEST A-1100 from Momentive Performance Materials |
| SR351 premix | 99% SR 351 trimethylolpropane triacrylate, available from Sartomer Corp, Westchester, Pennsylvania as SR351 and 1 wt. % 2-benzyl-2-N,N-dimethylamino-1-(4-morpholinophenyl)-1-butanone available as IRGACURE 369 from Ciba-Geigy Corp., Ardsley, New York |
| Filler | calcium metasilicate obtained as 400 WOLLASTACOAT from NYCO Minerals Inc., Willsboro, New York |
| OX50 | amorphous silica particles having an average surface area of 50 $m^2/g$, available as OX-50 from DeGussa Corp., Richfield Park, New Jersey |
| PR1 | resole phenolic liquid resin, obtained as 5136G from Dynea Erkner GmbH, Erkner, Germany |
| PR2 | Novolac phenolic powder resin, available as BAKELITE PF0224SP from Momentive Specialty Chemicals GmbH, Hessen, Germany |
| PAF | Potassium Aluminum Fluoride powder 200 mesh from KBM Master Alloys, Delfzijl, Netherlands |
| CB | Carbon Black powder obtained as LUVOMAXX LB/S from Lehmann & Voss & Co., Hamburg, Germany |
| SiC | Silicon Carbide 3C500 mineral powder grit F500 from Saint-Gobain Ceramic Materials, Aust-Agder, Norway |
| PO | paraffin oil BR162, obtained from STANCHEM sp. j. - Niemce, Poland |
| FA | furfuryl alcohol |
| Scrim | Fiberglass mesh, obtained as RXV10 from Rymatex Sp. Z.o.o., Rymanow, Poland |

Wet Rocker Drum Test

Abrasive articles to be tested were converted into 7.6 cm by 20.3 cm sheets. These test specimens were installed on a cylindrical steel drum testing machine which oscillated (rocked) back and forth in a small arc creating a 0.476 cm by 15.2 cm wear path. The workpiece was essentially perpendicular to the abrasive article and in frictional contact therewith. The abrasive abraded the 0.476 cm×0.476 cm face of a stationary type 1018 carbon steel workpiece having dimensions of 0.476 cm by 0.476 cm by an initial length of 15.2 cm. There were approximately 60 strokes per minute on this wear path. The load applied to the workpiece via a lever arm was 3.6 kg. During testing, water was continuously run onto the wear path to keep the specimen wet. The total amount of carbon steel removed after 500 cycles (i.e., one cycle being one back-and-forth motion) was recorded as the total cut. The testing was continued in 500 cycle increments until an endpoint was determined by either a significant drop in cut or by wear of the abrasive article to the backing.

Caliper measurements were recorded in 4 areas along the wear path and 4 areas adjacent to the wear path that were not abraded using a Brown & Sharpe Digit-Dial plus caliper gauge model 599-1033 attached to a Starrett granite surface plate at 2.54 cm from the end or beginning of the wear path and then every 3.175 cm along the wear path and unabraded adjacent area. The readings were recorded in inches and converted to mils. The four readings in each of the used and unused areas were average to obtain an average value for the unused feature height and the height in the wear path. The G ratio was calculated as the ratio of the total cut in grams divided by the total caliper loss in mils.

Tumbling Tubular Plasma Treatment Apparatus

Abrasive particles were treated in a home built plasma system comprising a 6-inch diameter Pyrex glass tube connected to a vacuum pump system comprising of a roots blower (Edwards Model EH1200, Hoc Edwards, West Sussex, United Kingdom) backed by a dry mechanical pump (Edwards Model iQDP80, Hoc Edwards). Gases were introduced into the glass tube at the center on one end of the glass tube by means of MKS mass flow controllers (MKS Power Generators and Subsystems, Wilmington, Mass.) and pumped from the other end of the glass tube. RF power was coupled to the chamber by means of a copper external electrode 6" (15 cm) wide and 12" (30 cm) long, rolled into the arc off circle, and confirmed to the outer diameter of the glass tube. A perforated metal enclosure around the glass tube and the powered electrode constituted as the ground electrode. RF power was delivered from a power supply (Model RF-30H available from RF Power Products, Kresson, N.J.) through an RF automatic matching network (Model AM-20 available from RF Power Products) Pressure in the chamber was determined by the flow rate of the gases, and was not independently controlled. The glass tube was rotated at 1.8 revolutions/minute. The system had a nominal base pressure of 5 mTorr (0.67 Pa). The flow rates of gases were controlled by flow controllers available from MKS Power Generators and Subsystems. Abrasive particles for deposition were placed inside the glass tube (and thus were located within the ion sheath formed upon plasma generation).

Preparation of AP2 (Plasma Treatment of AP1))

AP1 (500-2000 g) was placed inside the Tumbling Tubular Plasma Treatment Apparatus described above and the reactor chamber was pumped down to a pressure of 10 mTorr (1.33 Pa). Oxygen gas was then introduced at a flow rate of 250 scc/min and RF power was maintained at 320 watts with pressure in the 30-50 mTorr (4-7 Pa) range for 30 minutes. Following the oxygen plasma treatment, TMS vapor was added to the oxygen gas at a flow rate of 300 scc/min, RF power maintained at 320 watts and deposition of silicon-containing film continued for 30 minutes with the pressure in the 30-50 mTorr (4-7 Pa) range. After the deposition of the silicon-containing film was completed, the particles were further treated in a plasma comprising a 2 volume percent $SiH_4$ in argon mixture at a flow rate of 500 scc/min along with oxygen gas flowing at 250 scc/min, RF power at 320 watts for 60 minutes with pressure in the 50-100 mTorr (7-13 Pa) range. Following the plasma treatment process, the plasma treatment chamber was vented to atmosphere and the particles were removed.

Preparation of AP3

AP3 was prepared by treating AP1 with 0.1% A174 by weight of the mineral from a hydrolyzed dilute aqueous solution with pH adjusted to 3.52 with trifluoroacetic acid. The hydrolyzed silane solution was added to the particles and thoroughly mixed by shaking. The silane treatment process was finished by drying in an oven at 45° C. for 24 hours. The silane-treated mineral was de-agglomerated by forcing it through an appropriately sized screen.

Preparation of AP4

AP4 was prepared by treating AP2 with 0.1% A174 by weight of the mineral from a hydrolyzed dilute aqueous solution with pH adjusted to 3.5 with trifluoroacetic acid. The hydrolyzed silane solution was added to the particles and thoroughly mixed by shaking. The silane treatment process was finished by drying in an oven at 45° C. for 24 hours. The silane-treated mineral was deagglomerated by forcing it through an appropriately sized screen.

Example 1

Example 1 was prepared by mixing an abrasive slurry consisting of 24.75 parts of SR351 premix, 24.25 parts of Filler, 1 part of OX50, and 50 parts of AP4. The slurry was coated into a microreplicated polypropylene tool (having pyramidal cavities having average base width of 0.65 in (1651 micrometers), average height of 0.03 in (762 micrometers) and concave edges as described in the 030 SQRT entry in Table 3 of U.S. Pat. No. 7,300,479 (McArdle et al.)) using a tongue depressor and slurry-coated tooling was taped, slurry side first, to a backing. The backing for the abrasive article was an X-weight polyester backing having a latex/phenolic resin presize treatment (89 parts/15 parts based upon cured resin on the front side of the backing. The presize was applied to the backing and then heated to substantially remove any volatiles and to gel the phenolic resin. The samples were nipped between rollers to ensure good wetting of the slurry to the backing and then cured by irradiating the tooling side with an ultraviolet (UV) lamp, type D bulb, from Fusion UV Systems Inc., Gaithersburg, Md., at 600 Watts/inch (236 Watts/cm) while moving the web at 30 feet/minute (fpm) (9.14 meters/minute). The samples were post-cured for four hours at 115° C. resulting in a structured abrasive article.

Comparative Example A

Comparative Example A was prepared identically to Example 1, with the exception that the abrasive slurry was 24.25 parts of SR351 premix, 23.75 parts of Filler, 1 part of OX50, 1 part A174, and 50 parts of AP1.

Comparative Example B

Comparative Example B was prepared identically to Example 1, with the exception that AP3 was substituted by AP4.

Abrasive articles of Example 1 and Comparative Examples A and B were tested according to the Wet Rocker Drum Test. The comparative cut rate data and the comparative G-ratio data are reported in Table 2 (below). These data demonstrate the increase in cut rate and G-ratio of the abrasive article of Example 1.

TABLE 2

| CUT CYCLES | EXAMPLE 1 | COMPARATIVE EXAMPLE A CUT, grams | COMPARATIVE EXAMPLE B |
|---|---|---|---|
| 500 | 0.498 | 0.368 | 0.310 |
| 1000 | 0.565 | 0.495 | 0.416 |
| 1500 | 0.588 | 0.539 | 0.499 |
| 2000 | 0.619 | 0.595 | 0.544 |
| 2500 | 0.633 | 0.508 | 0.538 |
| 3000 | 0.616 | 0.455 | 0.528 |
| 3500 | 0.619 | 0.422 | 0.494 |
| 4000 | 0.575 | 0 | 0.398 |
| 4500 | 0.573 | 0 | 0 |
| 5000 | 0.597 | 0 | 0 |
| Total Cut | 5.883 | 3.383 | 3.727 |
| Caliper loss (mils) | 30 | 30 | 30 |
| G-Ratio | 0.20 | 0.11 | 0.12 |

Preparation of AP5

AP5 was made by preparing a boehmite sol-gel made by using the following recipe: aluminum oxide monohydrate powder (1600 parts) having the trade designation "DISPERAL" from Sasol North America, Houston, Tex., was dispersed by high shear mixing a solution containing water (2400 parts) and 70% aqueous nitric acid (72 parts) for 11 minutes. The resulting sol-gel was aged for at least 1 hour before coating. The sol-gel was forced into production tooling for making abrasive sample AP5 having triangular shaped mold cavities of 28 mils (0.711 mm) depth and 110 mils (2.794 mm) on each side. The draft angle between the sidewall and bottom of the mold was 98 degrees for each tooling. The parallel ridges were spaced every 0.277 mm and the cross section of the ridges was a triangle shape having a height of 0.0127 mm and a 45 degree angle between the sides of each ridge at the tip as described in U.S. patent publication number 2010-0146867. The sol-gel was forced into the cavities with a putty knife so that the openings of the production tooling were completely filled. A mold release agent, 1% peanut oil in methanol was used to coat the production tooling with about 0.5 mg/in of peanut oil applied to the production tooling. The excess methanol was removed by placing sheets of the production tooling in an air convection oven for 5 minutes at 45 degrees C. The sol-gel coated production tooling was placed in an air convection oven at 45 degrees C. for at least 45 minutes to dry. The precursor shaped abrasive particles were removed from the production tooling by passing it over an ultrasonic horn. The precursor shaped abrasive particles were calcined at approximately 650 degrees Celsius and then saturated with a mixed nitrate solution of the following concentration (reported as oxides): 7.0% of MgO and 0.05% CoO. The excess nitrate solution was removed and the saturated precursor shaped abrasive particles with openings were allowed to dry after which the particles were again calcined at 650 degrees Celsius and sintered at approximately 1400 degrees Celsius. Both the calcining and sintering was performed using rotary tube kilns Preparation of AP6

AP6 was prepared identically to AP5 with the exception that tooling had triangular shaped mold cavities of 12 mils (0.3045 mm) depth and 52.1 mils (1.323 mm) on each side. The draft angle between the sidewall and bottom of the mold was 98 degrees for each tooling and a 45 degree angle between the sides of each ridge at the tip.

Preparation of AP7 and AP8

AP7 and AP8 were prepared identically to AP2, with the exception that AP5 and AP6, respectively, were substituted for AP1.

Preparation of AP9 and AP10

AP9 and AP10 were prepared by treating AP7 and AP8, respectively, with 0.25 wt. % of A1100 by weight of the mineral from a hydrolyzed dilute aqueous solution in deionized water. The hydrolyzed silane solution was added to the particles and thoroughly mixed by shaking. The silane treatment process was finished by drying in an oven at 65° C. for 24 hours. The silane-treated mineral was de-agglomerated by forcing it through an appropriately sized screen.

Example 2

The abrasive articles of Example 2 were Cut-Off Wheels (type/shape 41), that were selected from the lot prepared according to the following procedure: AP9 (1254 grams) was mixed with 120 grams of PR1 and 5 ml of FA for 7 minutes in a KitchenAid mixer. This was Mix 1. Mix 2 was prepared by mixing 39.2 wt. % of PR2, 51.7 wt. % of PAF, 8.2 wt. % of SiC and 0.9 wt. % of CB in a Loedige mixer (FM 300D type) for 3 minutes. Mix 1 and Mix 2 were then combined and mixed in a KitchenAid mixer for 10 minutes. PO (10 ml) was added during mixing to control the mix viscosity and reduce dust development.

This mix was placed in an open shallow container and allowed to condition at room temperature and humidity for 16 hours. It was then screened through a screen with 2×2 mm openings to remove agglomerates. This screened mixture was then pressed in 125 mm diameter dies using a Maternini model SP 400C press machine. Scrim was placed in the die, 27 grams of the above mix was then added, and a second piece of Scrim was added. A thin paper label and a metal center hole bushing were added. This composition was then pressed at 390 kg/cm$^2$.

The cut-off wheels were then placed between metal plates, separated by PTFE-coated sheets in stacks and pressed together at 70 kg and fixed by screw. The stacks were placed in a curing oven. The oven was heated 1.5 hours at 75° C., 1.5 hours at 90° C., 4 hours at 110° C., 4 hours at 135° C., 3 hours at 188° C., then held at 188° C. for 8 hours. The heat was then turned off, and the oven was allowed to cool. After cooling, the cut-off wheels were disassembled from the aluminum and PTFE sheet stacks. The dimension of the final cut-off wheels were 124.9 mm to 125.1 mm diameter, and 1.24 to 1.34 mm thickness. The center hole diameter was 22.30 mm.

Example 3

The abrasive article of Example 3 was prepared identically to Example 2, except for the composition changes shown in Table 3. The dimension of the final cut off wheels was 125.0 mm to 125.2 mm diameter and 1.64 to 1.70 mm thickness. The center hole was 22.31 mm in diameter.

Comparative Examples C-D

Comparative Examples C and D were prepared identically to Example 2 except for the composition changes shown in Table 3.

Comparative Examples E-F

Comparative Examples E and F were prepared identically to Example 3, except for the composition changes shown in Table 3.

Comparative Example G

Comparative Example G was a commercially-available cut-off wheel obtained as 125×1.2×22 A60Q-BFXA Premium cut-off wheel, Type no. 77966 (nominal thickness: 0.045") from Tyrolit GmbH & Co. KG, Neuenrade, Germany.

Comparative Example H

Comparative Example H was a NORTON CHARGER RIGHTCUT 5"×0.045"×⅞" (13 cm×0.11 cm×2.2 cm) Type 1 cut-off wheel, Part No. 662528 26570 7 RC5CH (nominal thickness: 0.067"(0.17 cm)), from Saint Gobain Abrasives, Inc., Worcester, Mass.

Comparative Example I

Comparative Example I was a SAITECH 5'×0.045'×⅞' (13 cm×0.11 cm×2.2 cm) Type 1 cutoff wheel, Part No. 23177 (nominal thickness: 0.063" (0.16 cm)) from Manufacturing HDQ, North Windham, Conn.

Comparative Example J

Comparative Example J was a PFERD SG-ELASTIC 5'×0.045'×⅞' (13 cm×0.11 cm×2.2 cm) Type 1 cut-off wheel, Part No. EHT 125-1.6 R SG-INOX EDP 63608 (nominal thickness: 0.062" (0.16 cm)) from PFERD INC., Leominster, Mass.

TABLE 3

| MATERIAL | EXAMPLE 2 | COMPARATIVE EXAMPLE C | COMPARATIVE EXAMPLE D | EXAMPLE 3 | COMPARATIVE EXAMPLE E | COMPARATIVE EXAMPLE F |
| --- | --- | --- | --- | --- | --- | --- |
| | | | parts | | | |
| PR1 | 5.2 | 5.2 | 5.2 | 5.4 | 5.4 | 5.4 |
| PR2 | 13.423 | 13.423 | 13.423 | 13.439 | 13.439 | 13.439 |
| PAF | 17.71 | 17.71 | 17.71 | 17.73 | 17.73 | 17.73 |
| CB | 0.258 | 0.258 | 0.258 | 0.14 | 0.14 | 0.14 |
| SiC | 2.796 | 2.796 | 2.796 | 2.8 | 2.8 | 2.8 |
| PO | 0.2 | 0.2 | 0.2 | 0.2 | 0.2 | 0.2 |
| FA | 0.1 | 0.1 | 0.1 | 0.1 | 0.1 | 0.1 |
| Cement | 0-2 | 0-2 | 0-2 | 0-2 | 0-2 | 0-2 |
| Premix | 31.1 | 31.1 | 31.1 | 31.1 | 31.1 | 31.1 |
| AP5 | 0 | 60.399 | 0 | 0 | 0 | 0 |
| AP6 | 0 | 0 | 0 | 0 | 62.4 | 0 |
| AP7 | 0 | 0 | 60.399 | 0 | 0 | 0 |
| AP8 | 0 | 0 | 0 | 0 | 0 | 62.4 |
| AP9 | 60.399 | 0 | 0 | 0 | 0 | 0 |
| AP10 | 0 | 0 | 0 | 62.4 | 0 | 0 |

Right-Angle Cut-Off Test

The cut-off wheels were tested on a Maternini cut test machine, model PTA 100/230, from Davide Maternini SPA of Malnate, Italy, fitted with a 230V 4-inch Bosch grinder model GWS 6-100 (nominal rpm 10,000). The cut test machine was used at the following parameters: test program 125-SS-R, cutting current: 3.5 A, Factor kp=15, Factor kd=30. The work pieces were 16 mm solid 304 stainless steel rods. Both the average cut time and the number of cuts were recorded until the cut-off wheels reached a diameter of 100 mm. Comparative test results are shown in Table 4 (below), wherein Area Factor@End of Test is equal to (the cross sectional area of the workpiece×number of cuts) divided by the worn-away area of the cutoff wheel.

TABLE 4

| EXAMPLE | THICKNESS, millimeters | NUMBER OF CUTS | AVERAGE CUT TIME, seconds | AREA FACTOR @ END OF TEST |
| --- | --- | --- | --- | --- |
| Comparative Example G | 1.28 | 87 | 5.17 | 3.90 |
| | 1.26 | 91 | 5.06 | 4.02 |
| Comparative Example C | 1.25 | 101 | 4.60 | 4.63 |
| | 1.28 | 94 | 4.93 | 4.40 |
| | 1.27 | 91 | 5.01 | 4.15 |
| Comparative Example D | 1.24 | 140 | 4.15 | 6.49 |
| | 1.2 | 148 | 4.52 | 6.76 |
| | 1.24 | 155 | 4.71 | 7.02 |
| 2 | 1.25 | 160 | 4.36 | 7.47 |
| | 1.21 | 159 | 4.59 | 7.26 |
| | 1.24 | 160 | 4.72 | 7.31 |
| Comparative Example E | 1.64 | 249 | 5.94 | 11.54 |
| | 1.6 | 232 | 6.25 | 10.89 |
| | 1.64 | 260 | 6.60 | 12.17 |
| Comparative Example F | 1.65 | 345 | 5.51 | 15.67 |
| | 1.68 | 332 | 6.89 | 15.03 |
| 3 | 1.68 | 326 | 6.57 | 14.81 |
| | 1.7 | 376 | 6.20 | 17.23 |
| | 1.7 | 313 | 7.78 | 15.35 |
| | 1.65 | 335 | 6.63 | 15.80 |

Comparing Comparative Examples C and E with Comparative Examples D and F, respectively, about a 38-40 percent performance increase was achieved by plasma-treatment of the abrasive particles. Silane treatment of the plasma-modified abrasive particles (Examples 2 and 3) improved the life by about an additional 20 percent, resulting in a total of about 50-60 percent performance increase over the abrasive articles with untreated abrasive particles. The cut time decreased most noticeably (about 8-10 percent faster) on plasma-modified abrasive particles without additional silane treatment (Comparative Examples D and F).

Off-Hand Test 1

An abrasive cut-off wheel to be tested was mounted into a 5" (13 cm) Bosch right angle grinder (1803 EVS, 120V, 1.45 HP, 11.000 rpm) and a linear cut on a 3 mm thick sheet of stainless steel was made The initial diameter, final diameter, and thickness of the cut-off wheel were recorded. The endpoint of the test was either wearing of the cut-off wheel to a diameter of 68 mm or successfully cutting one meter of the stainless steel sheet, whichever occurred first. If the 68-mm diameter endpoint was reached, the length of the cut was recorded. If the one meter endpoint was reached, the time to complete that cut was recorded. Test data are shown in Table 5 (below).

TABLE 5

| EXAMPLE | INITIAL DIAMETER millimeters | FINAL DIAMETER millimeters | DIAMETER CHANGE, millimeters | WHEEL THICKNESS inch (mm) | TEST ENDPOINT Time for 68 mm final wheel diameter, seconds (length of cut at endpoint) | Time for 1 m cut, seconds |
| --- | --- | --- | --- | --- | --- | --- |
| Comparative Example C | 125 | 68 | −57 | 0.049 | 35 (0.53 m) | |
| Comparative Example D | 125 | 68 | −57 | 0.047 | 70 (1 m) | |

TABLE 5-continued

| EXAMPLE | INITIAL DIAMETER millimeters | FINAL DIAMETER millimeters | DIAMETER CHANGE, millimeters | WHEEL THICKNESS inch (mm) | TEST ENDPOINT Time for 68 mm final wheel diameter, seconds (length of cut at endpoint) | Time for 1 m cut, seconds |
|---|---|---|---|---|---|---|
| 2 | 125 | 68 | −57 | 0.047 | 60 (0.855 m) | |
| Comparative Example E | 125 | 102 | −20 | 0.064 | | 69 |
| Comparative Example F | 125 | 112 | −13 | 0.062 | | 60 |
| 3 | 125 | 118 | −7 | 0.063 | | 62 |
| Comparative Example H | 127 | 95 | −32 | 0.067 | | 75 |
| Comparative Example I | 128 | 68 | −60 | 0.063 | | 75 |
| Comparative Example J | 125 | 105 | −23 | 0.062 | | 81 |

Comparative Example D lasted almost 2× (cutting 1 m, rather than only 0.53 m) compared with Comparative Example C, while Example 2 showed about 50 percent improvement over Comparative Example C. For Example 3, both wheel wear and cut time decreased significantly vs. the comparative wheels.

Off-Hand Test 2

An abrasive cut-off wheel to be tested was mounted onto a 5-inch (13-cm) Bosch right angle grinder (1803 EVS, 120V, 1.45 HP, 11000 rpm) to make successive cuts through steel bar stock. The number of cuts made before the endpoint (reaching 68 mm wheel diameter) were recorded. The test data are shown in Table 6 (below).

TABLE 6

| EXAMPLE | NUMBER OF CUTS |
|---|---|
| COMPARATIVE EXAMPLE C | 38 |
| COMPARATIVE EXAMPLE D | 49 |
| 2 | 61 |
| COMPARATIVE EXAMPLE E | 129 |
| COMPARATIVE EXAMPLE F | 170 |
| 3 | 245 |
| COMPARATIVE EXAMPLE H | 57 |
| COMPARATIVE EXAMPLE I | 40 |
| COMPARATIVE EXAMPLE J | 71 |

While plasma-treatment (Comparative Example D) improved the performance of Comparative Example C by about 30 percent, additional silane treatment (Example 2) increased the overall performance by about 60 percent compared to Comparative Example C. The performance of Comparative Example F was improved about 32 percent vs. Comparative Example E, while additional silane treatment of Example 3 resulted in a total increase of about 90 percent, resulting in 3.5-6× performance increase over comparative commercial products.

In summary, when comparing different test methods (automatic vs. off hand), and different work piece shapes (bar stock vs. sheet metal), a clear ranking the performance of the wheels can be observed, plasma-modified mineral showing a performance improvement of the wheel wear (longer life), and additional silane treatment showing a performance increase.

Other modifications and variations to the present disclosure may be practiced by those of ordinary skill in the art, without departing from the spirit and scope of the present disclosure, which is more particularly set forth in the appended claims. It is understood that aspects of the various embodiments may be interchanged in whole or part or combined with other aspects of the various embodiments. All cited references, patents, or patent applications in the above application for letters patent are herein incorporated by reference in their entirety in a consistent manner. In the event of inconsistencies or contradictions between portions of the incorporated references and this application, the information in the preceding description shall control. The preceding description, given in order to enable one of ordinary skill in the art to practice the claimed disclosure, is not to be construed as limiting the scope of the disclosure, which is defined by the claims and all equivalents thereto.

What is claimed is:

1. Abrasive particles, each abrasive particle comprising:
a ceramic core, wherein the ceramic core does not comprise silica;
a shell layer at least partially enclosing the ceramic core, wherein the shell layer comprises silicon, oxygen, and hydrogen, wherein the shell layer comprises a silicate layer on the exterior surface of the ceramic core, and wherein the shell layer comprises silanol groups; and
at least one residue formed by condensation of a coupling agent with at least a portion of the silanol groups, wherein the residue is represented by the formula wherein R¹ has from 3 to 12 carbon atoms and is selected from the group consisting of epoxyalkyl groups, hydroxyalkyl groups, carboxyalkyl groups, aminoalkyl groups, acryloxyalkyl groups, and methacryloxyalkyl groups.

2. The abrasive particles of claim 1, wherein the abrasive particles conform to an abrasives industry specified nominal grade.

3. An abrasive article comprising abrasive particles according to claim 1 retained in an organic binder.

4. The abrasive article of claim 3, wherein the abrasive article comprises a bonded abrasive article.

5. The abrasive article of claim 3, wherein the abrasive article comprises a coated abrasive article.

6. The abrasive article of claim 3, wherein the abrasive article comprises a nonwoven abrasive article.

* * * * *

UNITED STATES PATENT AND TRADEMARK OFFICE
CERTIFICATE OF CORRECTION

PATENT NO. : 10,005,171 B2
APPLICATION NO. : 14/392224
DATED : June 26, 2018
INVENTOR(S) : Scott Culler Page 1 of 1

It is certified that error appears in the above-identified patent and that said Letters Patent is hereby corrected as shown below:

In the Specification

<u>Column 15</u>
Line 1, Delete "Hoc" and insert -- Boc --, therefor.

<u>Column 15</u>
Line 3, Delete "Hoc" and insert -- Boc --, therefor.

<u>Column 15</u>
Line 9, Delete "off" and insert -- of a --, therefor.

Signed and Sealed this
Nineteenth Day of February, 2019

Andrei Iancu
*Director of the United States Patent and Trademark Office*